(12) United States Patent
Yamada (10) Patent No.: US 6,810,497 B2
(45) Date of Patent: Oct. 26, 2004

(54) SEMICONDUCTOR INTEGRATED CIRCUIT COMPENSATING VARIATIONS OF DELAY TIME

(75) Inventor: Takashi Yamada, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 452 days.

(21) Appl. No.: 09/767,945

(22) Filed: Jan. 24, 2001

(65) Prior Publication Data

US 2001/0024136 A1 Sep. 27, 2001

(30) Foreign Application Priority Data

Jan. 24, 2000 (JP) ......................................... 2000-014372

(51) Int. Cl.[7] .......................... G11R 31/28; H03H 11/26
(52) U.S. Cl. ...................................... 714/724; 327/276
(58) Field of Search ................................ 714/718, 724, 714/731, 738, 744; 327/261, 276, 284

(56) References Cited

U.S. PATENT DOCUMENTS

| | | | | |
|---|---|---|---|---|
| 5,455,840 A | * | 10/1995 | Nakauchi et al. | 375/371 |
| 5,621,739 A | * | 4/1997 | Sine et al. | 714/724 |
| 5,767,715 A | * | 6/1998 | Marquis et al. | 327/159 |
| 5,781,056 A | * | 7/1998 | Fujii | 327/276 |
| 5,973,526 A | * | 10/1999 | Dabral | 327/170 |
| 5,986,486 A | * | 11/1999 | Nichols | 327/156 |
| 5,990,719 A | * | 11/1999 | Dai et al. | 327/244 |
| 6,078,514 A | * | 6/2000 | Takemae et al. | 365/63 |
| 6,081,145 A | * | 6/2000 | Bandai et al. | 327/231 |
| 6,119,251 A | * | 9/2000 | Cloud et al. | 714/718 |
| 6,124,744 A | * | 9/2000 | Oowaki | 327/262 |
| 6,329,858 B1 | * | 12/2001 | Sobue | 327/231 |
| 6,381,722 B1 | * | 4/2002 | Salmon et al. | 714/745 |

FOREIGN PATENT DOCUMENTS

| | | |
|---|---|---|
| JP | 5-152935 | 6/1993 |
| JP | 6-131869 | 5/1994 |
| JP | 7-264056 | 10/1995 |
| JP | 8-136621 | 5/1996 |
| JP | 8-223018 | 8/1996 |
| JP | 9-139656 | 5/1997 |
| JP | 10-228770 | 8/1998 |
| JP | 11-120770 | 4/1999 |

* cited by examiner

*Primary Examiner*—Guy J. Lamarre
*Assistant Examiner*—Matthew C. Dooley
(74) *Attorney, Agent, or Firm*—Young & Thompson

(57) ABSTRACT

A semiconductor device includes a first circuit and a second circuit cascaded therefrom, a pattern examination section for examining the input signal pattern for the first circuit to estimate a delay in the first circuit, a delay control block for controlling an internal source potential based on the estimated delay for controlling the source potential for the second circuit so that the signal delay from the second circuit has small variations of delay time. The integrated circuit can be formed on a reasonable specification, and achieves a lower dissipation and a higher reliability.

20 Claims, 10 Drawing Sheets

SEMICONDUCTOR INTEGRATED CIRCUIT COMPENSATING VARIATIONS OF DELAY TIME

BACKGROUND OF THE INVENTION (a) Field of the Invention

The present invention relates to a semiconductor integrated circuit compensating variations of delay time and, more particularly, to a technique for compensating variations of delay time cause by an input signal pattern.

(b) Description of the Related Art

In a semiconductor device, the circuit specification is generally limited by a delay time for signal processing. Especially, the circuit specification is limited by a largest delay time among the delay times for signal processing based on a variety of input signal patterns.

Figure 1:
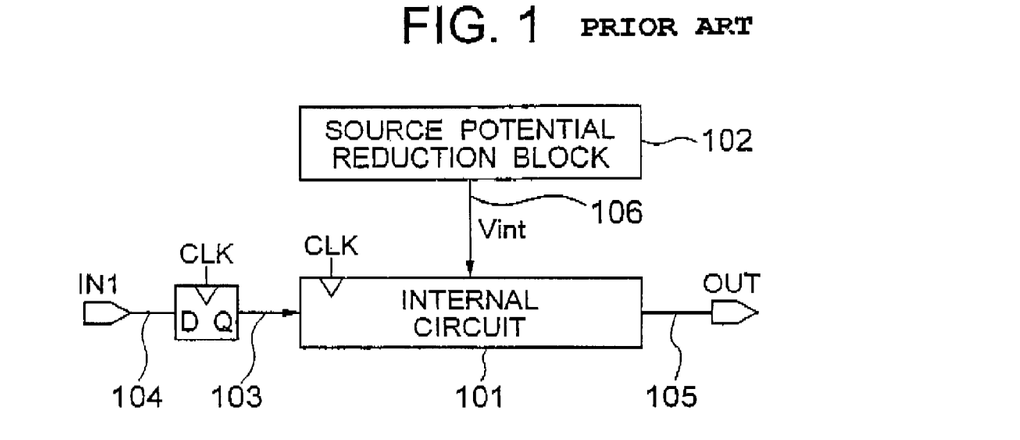
FIG. 1 is a block diagram of a conventional semiconductor integrated circuit having a potential reduction circuit.

Referring to FIG. 1, a conventional semiconductor integrated circuit includes an internal circuit 101, input flip-flops 103, and a source potential reduction circuit 102, wherein the input flip-flops 103 receive input data IN1, which have various signal patterns, through input signal lines 104 to deliver the input data to the internal circuit 101. The internal circuit 101 acts as a functional circuit, which operates therein for processing the input data IN1 to deliver output data through the output signal lines 105 after the processing. The internal circuit 101 may be called a functional circuit.

The power source potential Vint is supplied to the internal circuit 101 from the source potential reduction circuit 102 which generates a reduced potential for the source potential Vint and delivers the same through an internal source line 106 for achieving alleviation of the electric field and reduction of the power dissipation in the internal circuit 10. The reduced source potential Vint allows reduction of the dimensions of the semiconductor elements in the internal circuit 101, whereby the semiconductor integrated circuit has a lower power dissipation and a reduced occupied area thereof as well as a higher operational reliability of the internal circuit 101.

In general, a higher internal source potential allows a higher operational speed in an LSI (large-scaled integrated circuit). In the case of the internal circuit 101 being implemented by a static circuit having CMOS transistors, the power dissipation of the internal circuit is expressed by C Vint×Vint/2 wherein C is the sum of the load capacitances of the internal circuit. Thus, by reducing the internal source potential Vin, the power dissipation can be effectively reduced irrespective of some power dissipation caused in the source potential reduction circuit 102. The source potential reduction circuit 102 may be provided outside the chip of the semiconductor integrated circuit as a power IC (integrated circuit) or a DC—DC (direct current-direct current) converter.

The internal circuit 101 outputs the results of the processing therein based on input signal patterns, and the delay of the internal circuit 101 or the operational speed thereof depends on the input signal patterns IN1 received therein.

Figure 2:
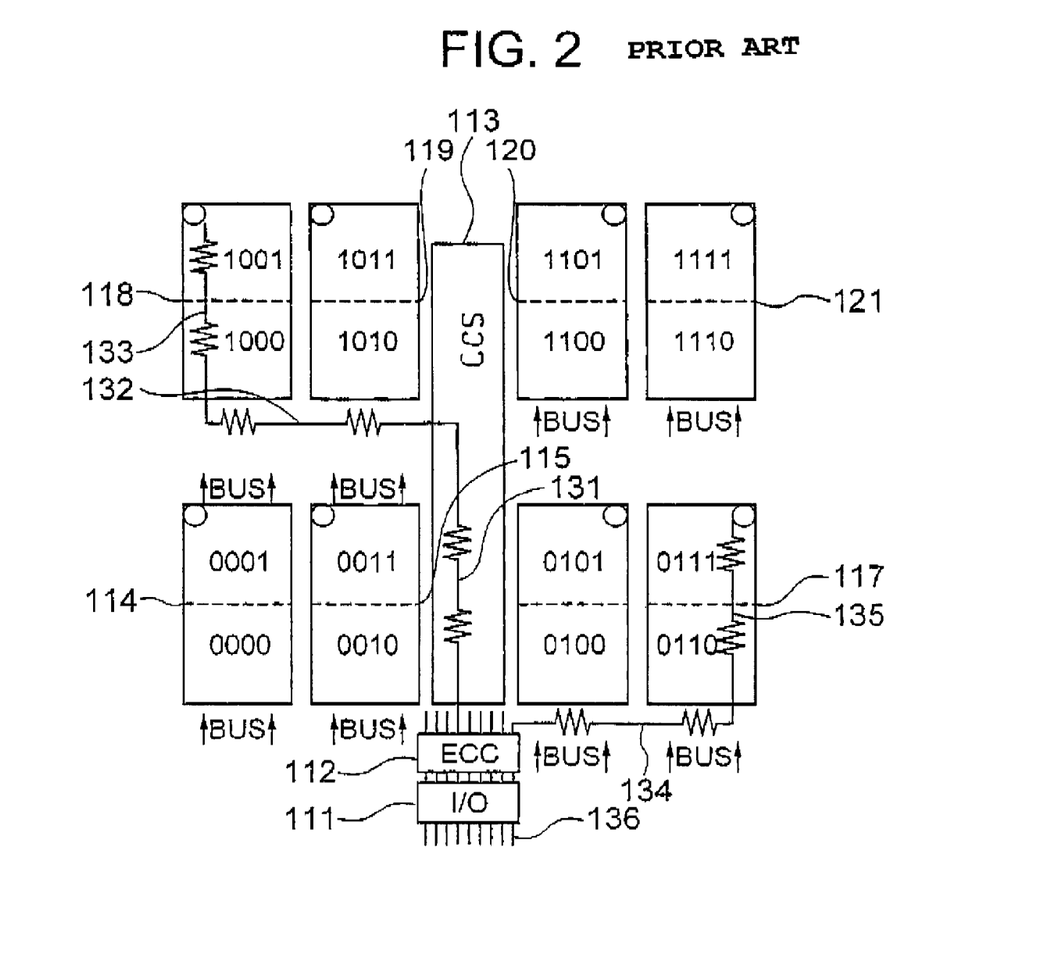
FIG. 2 is a block diagram of a conventional memory device shown as one of the conventional semiconductor integrated circuits.

For example, if the input data IN1 are address signals for a semiconductor memory device such as shown in FIG. 2, the input signal patterns IN1 specify the locations of the memory cells accessed by the input signal patterns in the chip of the memory device. In this case, the read time for the memory cells depends on the distance of the signal path between the input/output section 111 and the accessed memory cells.

More specifically, the semiconductor memory device of FIG. 2 includes a plurality of memory banks 114 to 121, each of which includes a plurality of memory cells arranged in a matrix. Each of the memory cells is connected to a bus line such as 132 and 134 via an in-bank line such as 133 and 135. The bus lines 132 and 134 are connected to an ECC (error correcting code) section 112 directly or via signal line 131, which pass through a control circuit section (CCS) 113.

The ECC section 112 is connected to an input/output (I/O) section 111, which functions as interface with external circuits.

The I/O lines 136 corresponds to both the input signal line 104 and the output signal line 105 in FIG. 1, and the flip-flops 103 correspond to a part of the I/O section 111. The potential reduction circuit 112 corresponds to a part of the control circuit section 113, and the rest of the constituent elements in FIG. 1 is included in the internal circuit 101.

In operation, the address signal supplied through the I/O section 111 passes the ECC section 112, and is decoded in the control circuit section 113. More specifically, the most significant three bits of the address signals specify one of the eight memory banks 114 to 121, and the next significant fourth bit specifies one of the pair of half sections in each memory bank. The remaining less significant bits specify the address of the desired memory cells in each half section in each memory bank by using a row decoder and a column decoder. The read data from the specified memory cells include redundancy data for an error correction as well as the data stored in the specified memory cells.

The read data are transferred from the in-bank signal lines 133 or 135, via the bus lines 132 or 134 after amplification thereof, to the ECC section 112. The read data from the far memory banks 118 to 121 are transferred additionally via signal lines 131 which pass through the control circuit section 113. The ECC section 112 operates for an error correction processing based on the redundancy data, and outputs the read data to the I/O section 111 after the error correction. The I/O section 111 delivers the read data outside the memory device via the I/O lines 136.

Figure 3:
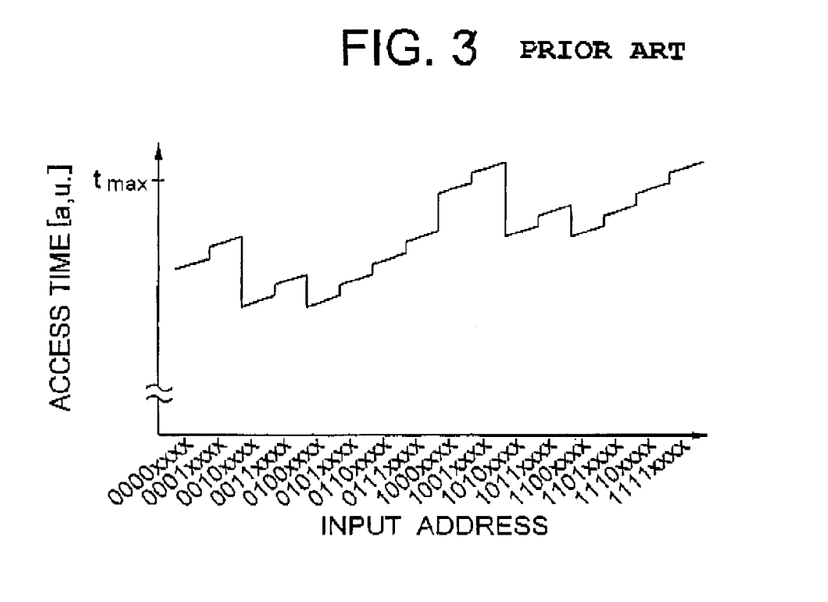
FIG. 3 is a graph showing the access time of the memory device of FIG. 2 plotted against the input address signal or input signal pattern.

The travel distance both for input address signals to reach selected memory cells and for the read data to be output depends on the input address patterns, whereby the access time with selected memory cells follows the exemplified graph shown in FIG. 3. Each of the input addresses shown therein includes most significant four bits which specify the memory bank as well as the half section thereof and the other less significant bits which specify the memory cell therein. Abrupt changes in the graph are due to the difference in the path length between the half section of the memory bank and the I/O section 111, whereas the gradual (upward) change between the adjacent abrupt changes is due to the difference in path length between the memory cells in each half section of each memory bank.

The dependency of the access time on the input address pattern shown in FIG. 3 follows the configuration of the memory banks 114 to 121, location or arrangement of the I/O section 111, the material or structure of the signal lines such as 131, electric characteristics of the transistors for driving the signal lines etc. The variation of the delay time depending on the input signal pattern is inevitable because all the memory cells cannot be located at a single position. Thus, the maximum delay time $t_{max}$, as shown in FIG. 3, is considered to represent the performance of the overall circuit.

The variations of the delay time due to the input signal patterns also result from, in addition to the different path lengths, a different speed at which each instruction is executed by such circuits as CPU (central processing unit), MPU (micro processing unit), DSP (digital signal processor) or so on which interprets a variety of commands and executes the interpreted command in case by case. In the processor, such simple instructions as logical operation coexist with such complicated instructions as multiplication. This fact causes large difference of delay times depending on input commands. In specification, delay time of each command is raised to agree with one—several fold clock cycles, therefore a fractional difference of delay time remains to be compensated by this invention.

Figure 4:
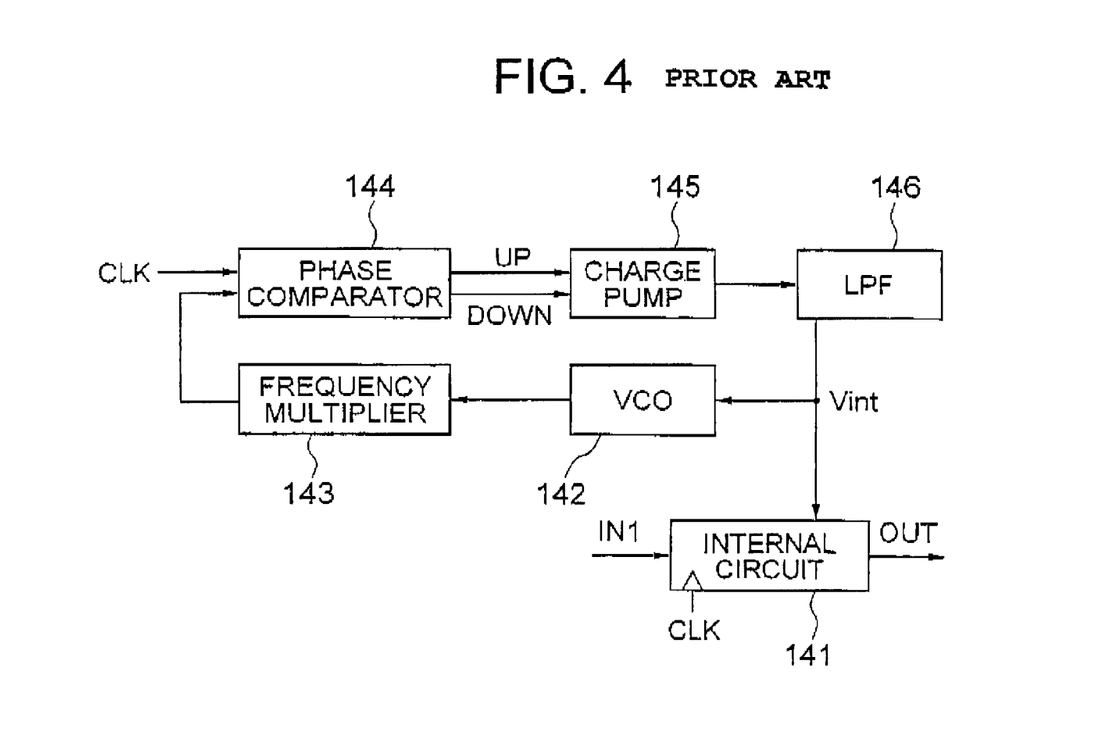
FIG. 4 is a block diagram of another conventional circuit described in a publication.

"IEEE JOURNAL OF SOLID-STATE CIRCUITS", VOL. 25, October, 1990, pp1136–1140 describes a compensating circuit for compensating the variations of the delay time by using a phase locked loop. FIG. 4 shows the described compensating circuit used for an internal circuit 141. The compensating circuit with phase locked loop includes a voltage controlled oscillator (VCO) 142, a frequency divider 143, a phase comparator 144, a charge pump 145 and a low-pass filter 146.

The low-pass filter 146 of the compensating circuit supplies an internal source potential Vint to the internal circuit 141 and the VCO 142, which outputs a frequency based on the internal source potential Vint. The frequency divider 143 divides the output frequency of the VCO 142 into 1/N, and the comparator 144 compares an output from the frequency divider 143 with the external clock signal CLK. The comparator 144 delivers an UP signal if the clock signal CLK leads in phase with respect to the output from the frequency divider 143 and delivers a DOWN signal if the clock signal CLK lags in phase with respect to the output from the frequency divider 143. The charge pump 145 raises the output current thereof to the low-pass filter 146 upon receiving the UP signal, thereby raising the internal source potential Vint. The charge pump 145 lowers the output current thereof to the low-pass filter 146 upon receiving the DOWN signal thereby lowering the internal source potential Vint. The low-pass filter 146 suppresses the fluctuation of the internal source potential Vint.

Thus, the internal source potential Vint is controlled so that the output frequency from the VCO 142 assumes 1/N of the frequency of the external clock signal CLK. In this scheme, if the semiconductor integrated circuit is designed so that the change of the delay time of the internal circuit 141 under being supplied with the internal source potential Vint corresponds to the change of the output frequency of the VCO 142 against the variations caused by the fabrication process, change of the operational temperature and the fluctuations of the external power source potential Vdd, the relationship between the delay time of the internal circuit 141 and the clock cycle of the clock signal CLK is free from the influence by these variations.

Figure 5:
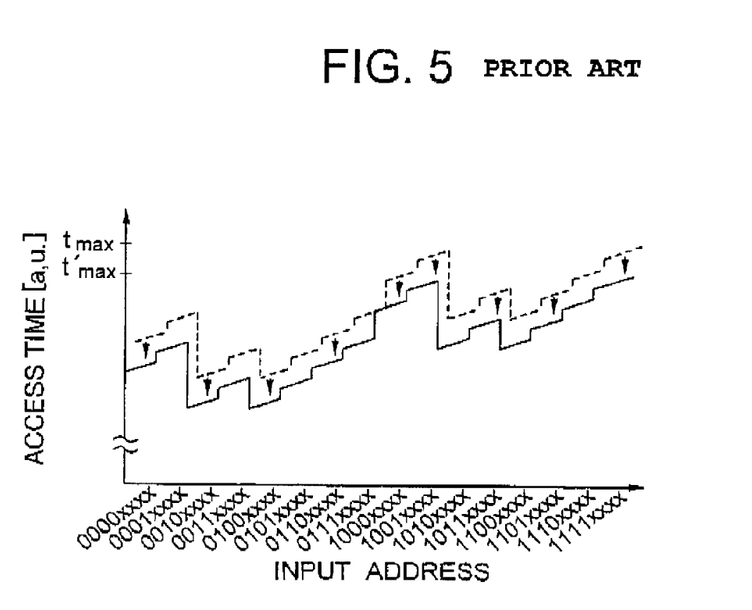
FIG. 5 is a graph showing the access time of the circuit of FIG. 4.

FIG. 5 shows the improved access time obtained in the internal circuit 141 shown in FIG. 4, plotted by solid line, and compared to the access time in the conventional circuit of FIG. 1 which is plotted by dotted line. The dotted line shows, in addition to the variations caused by the input signal pattern, variations of the delay time caused by variations of fabrication process, operational temperature and external source potential Vdd.

On the other hand, in the described circuit of FIG. 4, the delay time of the respective elements in the VCO 142 and the delay time of the respective elements in the internal circuit 141 change similarly to one another upon variations of fabrication process, operational temperature and external source potential Vdd. Thus, the control of the internal source potential Vint allows the access time to be reduced from the dotted line to the solid line, and the overall performance of the internal circuit can be expressed by the maximum reduced delay time $t'_{max}$.

In the described circuit, however, the variations of the access time caused by the input signal patterns remain similarly to the conventional circuit. The technique for compensating the variations of the delay time is also described in Patent Publications JP-A-8-223018, -7-264056, and -9-139656, which involve similar problems however.

As described above, first, the conventional integrated circuit has variations of the delay time caused by the input signal pattern, and the performance of the integrated circuit is limited by a few of the possible signal patterns. Since the chip size of the integrated circuit becomes larger and the variations of the delay time oftener limit the performance of the integrated circuit along with the higher-speed operation thereof, the dependency of the delay time on the input signal pattern will become larger.

Second, reduction of the power dissipation is not satisfactory because the internal source potential Vint of the internal circuit is adjusted at a relatively higher potential for adapting the specific input patterns, such as "1001XXXX" and "1111XXXX" shown in FIG. 5, which provide larger delay times for the read time.

Third, improvement of the reliability of the semiconductor integrated circuit is limited due to the reason specified above in connection with the limited reduction of the power dissipation, because higher voltage applied to elements constituting the circuits lead to lower reliability.

SUMMARY OF THE INVENTION

In view of the above, it is an object of the present invention to provide a semiconductor integrated circuit capable of compensating variations of delay time for signal processing to obtain a reasonable specification for the semiconductor device without degrading a high reliability thereof.

In one aspect of the present invention, the present invention provides a semiconductor integrated circuit including an input section for receiving an input signal pattern, an internal circuit for operating based on the input signal pattern for a specific function, a pattern examination block for examining the input signal pattern to estimate a delay time in the internal circuit and deliver a delay control signal based on the estimated delay time, and a delay control block for controlling the delay time of at least a part of the internal circuit based on the delay control signal.

In accordance with the semiconductor integrated circuit of the present invention, the control of the delay time in the internal circuit based on the delay control signal can reduce variations of the delay time in the output of the internal circuit caused by the input signal pattern The control of the delay time can be obtained by controlling the internal source potential of the at least a part of the internal circuit, controlling the back bias voltage of the transistors in the at least a part of the internal circuit, as described in "Substrate Noise Influence on Circuit Performance in Variable Threshold-Voltage Scheme" in the "Proceedings of the International Symposium on Low Power Electronics and Design 1996", pp.309–312, or controlling both the internal source potential and the back bias voltage, as described in "Elastic-Vt CMOS Circuits for Multiple On-Chip Power Control" in the "Solid-State Circuits Conference", pp.300–301.

Both the descriptions in the publications for controlling the internal source voltage and/or the back bias voltage are incorporated in this text by reference.

The above and other objects, features and advantages of the present invention will be more apparent from the following description, referring to the accompanying drawings.

PREFERRED EMBODIMENTS OF THE INVENTION

Now the present invention will be more specifically described with reference to accompanying drawings wherein similar constituent elements are designated by similar reference numerals.

Figure 6:
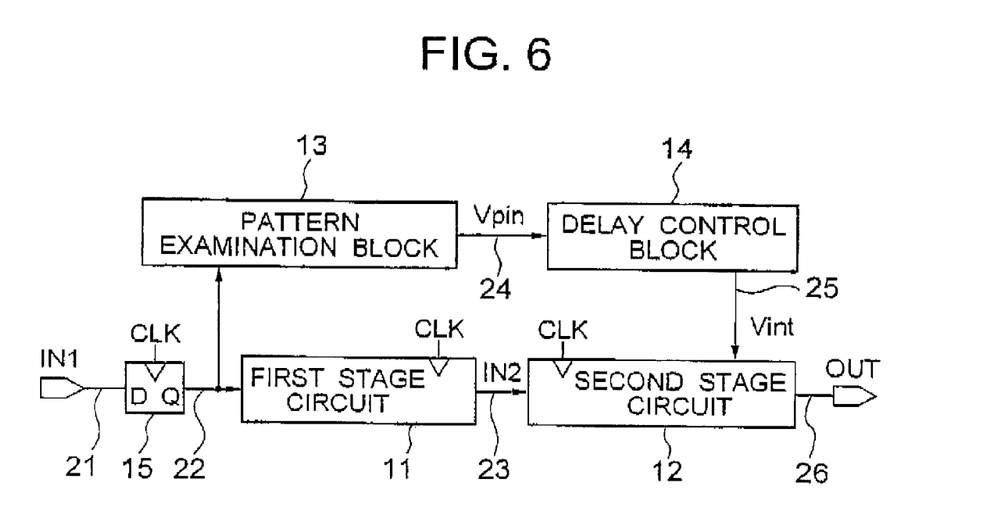
FIG. 6 is a block diagram of a semiconductor integrated circuit according to a first embodiment of the present invention.

Referring to FIG. 6, a semiconductor integrated circuit according to a first embodiment of the present invention includes a first stage internal circuit 11, a second stage internal circuit 12, a pattern examination block 13, a delay control block 14 and a plurality of input flip-flops 15. The pattern examination block 13 acts for estimation of the delay time or operational speed in the first stage internal circuit 11, whereas the delay control block 14 acts for control of the operational speed of the second stage internal circuit 12 by controlling the internal source potential Vint. The semiconductor integrated circuit includes a plurality input signal lines 21 each receiving a bit of the input signal (or input address pattern) to deliver the received bit to a corresponding one of the flip-flops 15. The plurality of signal lines may be a single signal lines instead.

The input flip-flop 15 receives a clock signal CLK at the clock input thereof, and delivers the input signal IN1 as it is upon detection of a rise of a clock pulse. Upon fall of the clock pulse, the input flip-flop 15 holds the input signal IN1 therein and is isolated from the input signal line 11, with the output thereof maintained on the signal line 22.

The signal lines 22 are connected to the inputs of the first stage internal circuit 11, and also connected to the inputs of the pattern examination block 13. The first stage internal circuit 11 and the second stage internal circuit 12 are cascaded via the signal lines 23 carrying the input data IN2, controlled by the clock signal CLK for signal processing, and deliver the output data via the output signal line or signal lines 26.

The pattern examination block 13 examines the input signal pattern transferred on the signal lines 22, estimates the delay time of the signal transferred from the first stage internal circuit 11 to the second stage internal circuit 12, and delivers a delay control signal Vpin to the delay control block 14 via signal lines 24 based on the estimated delay time.

The delay control block 14 controls the internal source potential Vint based on the received delay control signal Vpin and delivers the controlled internal source potential Vint via the internal source line or source lines 25. The internal source potential Vint adjusts the operational speed (or delay time) in the second stage internal circuit 12 to obtain an equal overall delay time of the output signal from the internal circuit. A plurality of internal source potentials may be supplied to the second stage internal circuit 12 via respective source lines 25. These blocks and circuits are integrated on a single chip in the present embodiment, or otherwise may be formed on a plurality of chips which are connected together by a printed circuit board.

The first stage and second stage internal circuits 11 and 12 may be implemented by a memory device such as shown in FIG. 2. In such a case, the ECC section 112 in FIG. 2 constitutes the second stage internal circuit 12 in FIG. 6, whereas other circuit blocks in FIG. 2 constitute the first stage internal circuit 11 in FIG. 6. The input section 111 constitutes the pattern examination block 13 and the input flip-flops 15, whereas the CONTROL CIRCUIT SECTION 113 constitutes the delay control block 14. The internal source potential Vint is supplied to the ECC section 112 from the delay control block 14, whereas the external source potential Vdd is delivered to the other circuit sections.

Figure 7:
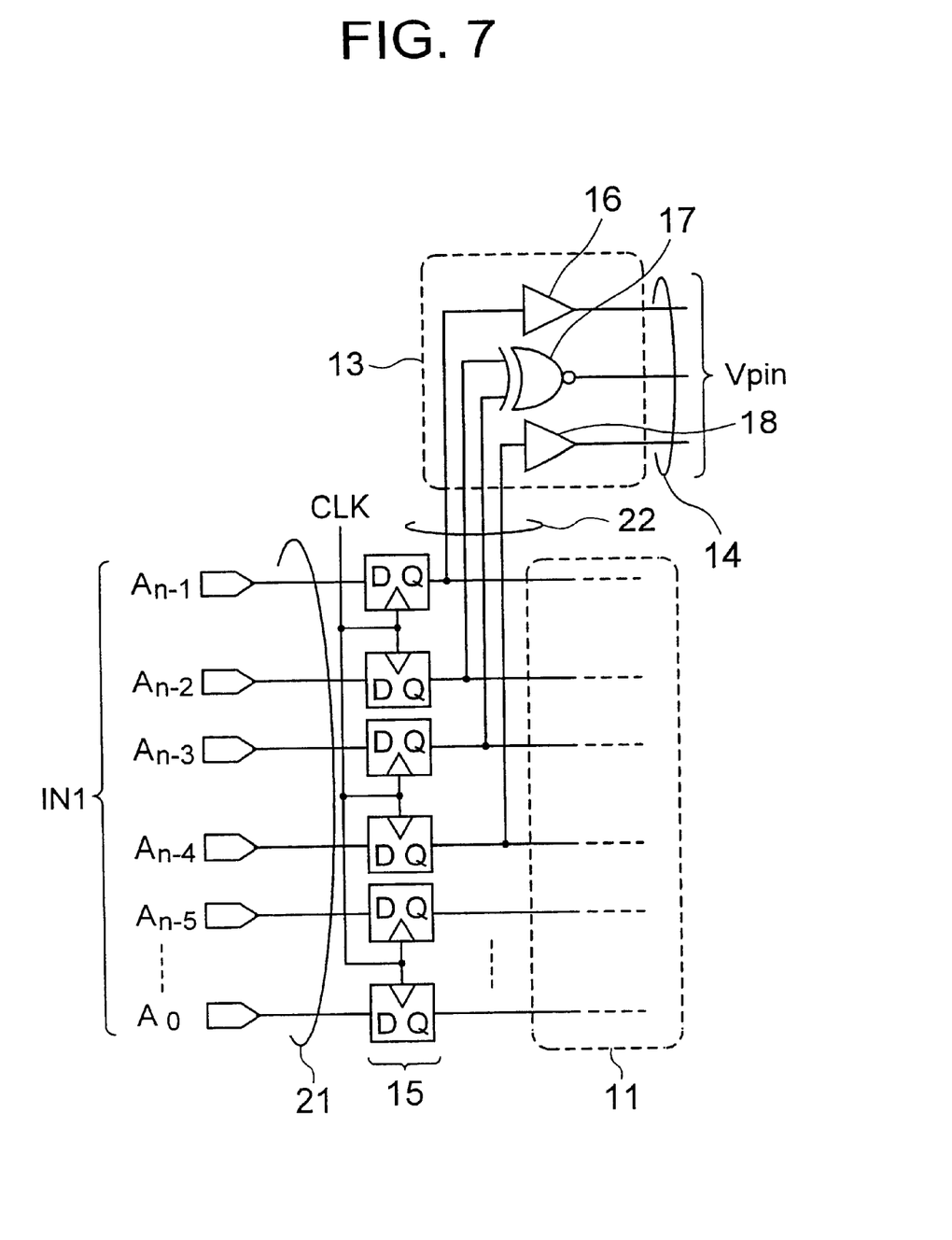
FIG. 7 is a circuit diagram of an example of the pattern examination block 13 shown in FIG. 6.

Referring to FIG. 7, an example of the pattern examination block 13 in FIG. 6 is used in a memory device such as shown in FIG. 2, and receives most significant four bits of the n-bit address signal IN1. The pattern examination block 13 includes a buffer 16 for receiving MSB $A_{n-1}$, an Ex-NOR gate 17 having inputs for receiving next most significant tow bits $A_{n-2}$ and $A_{n-3}$, and a buffer 18 for receiving fourth most significant bit $A_{n-4}$, and delivers a 3-bit output delay control signal Vpin from these buffers and gate 16 to 18.

Figure 8:
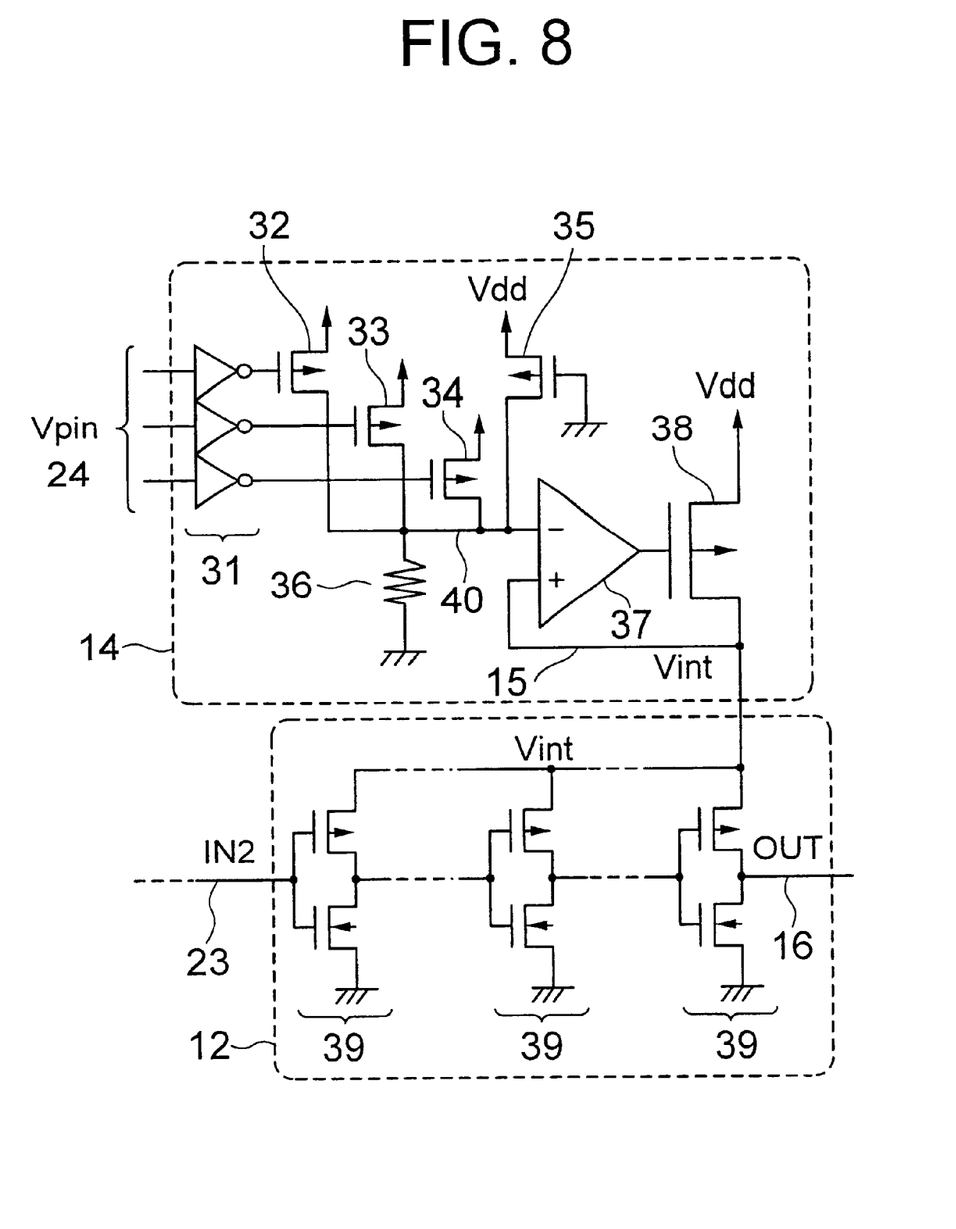
FIG. 8 is a circuit diagram of an example of the delay control block 14 shown in FIG. 6.

Referring to FIG. 8, an example of the delay control block 14 in FIG. 6 is implemented by a voltage regulator, which receives the delay control signal Vpin from the pattern examination block 13 of FIG. 7. The delay control bock 14 includes three inverters 31 for receiving the delay control signal Vpin, three p-ch transistors 32 to 34 each for receiving an output from one of the inverters 31 and having a source connected to the external source line Vdd, an operational amplifier 37 having an inverting input connected to the drains of the p-ch transistors 32 to 34, and a p-ch drive transistor 38.

The p-ch drive transistor 38 has a source connected to the external source line Vdd, a gate connected to the output of the operational amplifier 37 and a drain connected to the non-inverting input of the operational amplifier 37 and constituting the internal source line Vint. The inverting input of the operational amplifier 37 is connected to the external source line Vdd through a p-ch transistor 35 having a gate grounded, and connected to the ground through a resistor.

The design sizes of the three p-ch transistors 32 to 34 are such that the p-ch transistor receiving a more significant bit has a design size larger than the design size of the p-ch transistor receiving a less significant bit for weighing based on the significance of the bits. The p-ch transistor 35 has a further lager design size and carries current to some extent irrespective of the delay control signal Vpin. The internal source line Vint extends in the second stage internal circuit, and the logic gates 39 therein are connected to the internal source line 39. Although the logic gates 39 are expressed as cascaded inverters, these logic gates are in fact connected to have a specified function.

In operation of the integrated circuit of FIG. 6, when a clock pulse rises in the clock signal CLK, the input signal IN1 is transferred to the internal circuits 11 and 12 as well as the pattern examination block 13 via signal lines 21 and 22. The pattern detection circuit 13 receives at least a part of the input signal IN1. The internal circuits 11 and 12, after operating for processing of the input signal IN1, deliver output data OUT through the output signal lines 16. During the operation in the internal circuits 11 and 12, the input flip-flops 15 stores the input signal IN1 and thus a malfunction is not caused by the input of the next input signal.

On the other hand, the pattern examination block 13 examines the input signal pattern, judges the total delay time of the output signal from the internal circuits 11 and 12, and delivers the delay control signal Vpin to the delay control block 14 based on the judged delay time. The delay control block 14 controls the internal source potential Vint for the second stage internal circuit 12 based on the delay control signal Vpin. A higher internal source potential Vint accelerates the operational speed and increases the power dissipation of the second stage internal circuit 12. The internal source potential Vint is controlled by the pattern examination block 13 and the delay control block 14 to assume a minimum voltage that enables the sum of the delay times in the first and second stage internal circuits 11 and 12 to assume a desired delay time.

The time length until the delay control block 14 stabilizes the internal source potential Vint since the input of the input signal IN1 is adjusted to be commeasurable to or smaller than the time length during which the first stage internal circuit 11 operates for processing the input signal IN1 to deliver the processed output to the second stage internal circuit 12. For this purpose, the first stage internal circuit 11 is separated from the second stage internal circuit 12 in the design of the internal circuit. This allows the internal source potential Vint to assume an optimum voltage before the time instant at which input data IN2 is supplied to the second stage internal circuit 12. Thus, an erroneous operation due to a fluctuation of the power source potential Vint does not occur during operation of the second stage internal circuit 12. In the example shown in FIG. 1, the clock signal CLK is supplied to the first and second stage circuits 11 and 12 which are designed as synchronous circuits. However, the clock signal itself is not inevitable.

The practical operation of the integrated circuit of FIG. 6 wall be further described hereinafter by assuming the integrated circuit of FIG. 6 is implemented by a memory device such as shown in FIG. 2, with the pattern examination block 13 and the delay control block 14 being implemented by the practical circuits shown in FIGS. 7 and 8, respectively.

Referring to FIG. 7, the pattern examination block 13 includes buffers 21 and 23 and an Ex-OR (exclusive OR) gate 22, as described before. Thus, the output pattern Vpin of the pattern examination block 13 is "000" if the input signal IN1 assumes "0010" or "0100", Vpin="001" if IN1 assumes "0011" or "0101", Vpin="010" if IN1="0000" or "0110", Vpin="011 if IN1="0001" or "0111", and Vpin= "111" if IN1="1001" or "1111". That is, value of the delay control signal Vpin depends on the distance between the ECC section 112 and the section of the memory bank having the memory cell specified by the input address signal IN1. In other words, the delay control signal Vpin assumes a larger value for a larger delay time of the read data corresponding to the magnitude of the delay time.

Referring to FIG. 8, in the delay control block 14, the potential of the inverting input 40 of the operational amplifier 37 depends on the product of the resistance of resistor 36 by the current flowing through resistor 36, which is equal to the sum of the current carried by the p-ch transistors 32 to 35. Thus, the value of the delay control signal Vpin specifies the potential of the inverting input 40 of the operational amplifier 37.

The design size of p-ch transistor 32 corresponds to the delay time caused by the resistance of the signal line 131 passing through the CONTROL CIRCUIT SECTION 113 in FIG. 2, the design size of p-ch transistor 33 corresponds to the delay time caused by the resistance of bus lines 132 and 134, the design size of p-ch transistor 34 corresponds to the delay time caused by the resistance of the in-bank signal lines 133 and 135, and the design size of p-ch transistor 35 corresponds to the delay time other than the delay times caused by the resistance of signal lines such as 133, 135, 132, 134 and 131.

Figure 9:
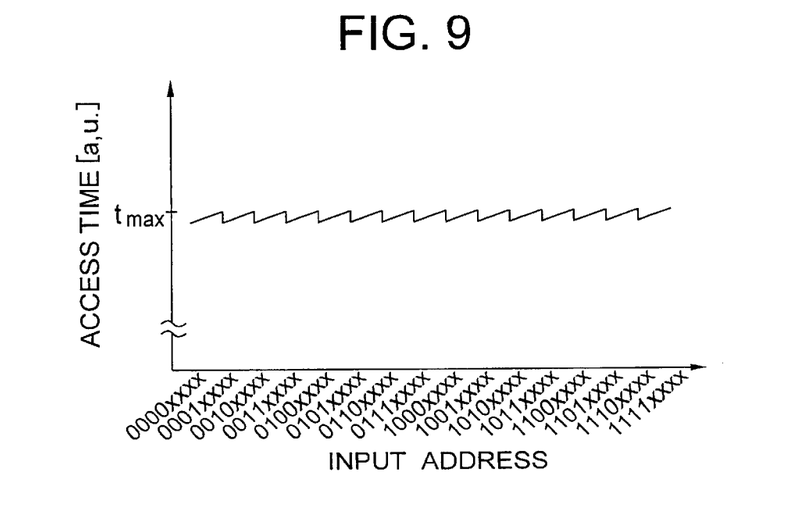
FIG. 9 is a graph showing dependency of delay time on the input signal pattern.

In the above operation of the present embodiment, the dependency of the access time or read time on the input address signal pattern is such that shown in FIG. 9, wherein the access time is plotted against input address pattern. The most significant four bits of the address pattern corresponds to the section of each memory bank shown in FIG. 2. In FIG. 9, the variations of the access time correspond to the difference of the locations or signal path lengths between the memory cells within the half section of each memory bank. The variation of the access time can be further reduced if the difference in the signal path length between the memory cells is further reflected on the configurations of the pattern examination block 13 and the delay control block 14. However, these configurations should be determined in consideration of the circuit scale for the pattern examination block 13 and the delay control block 14 as well as the maximum delay time $t_{max}$ which limits the circuit performance of the integrated circuit.

Figure 10:
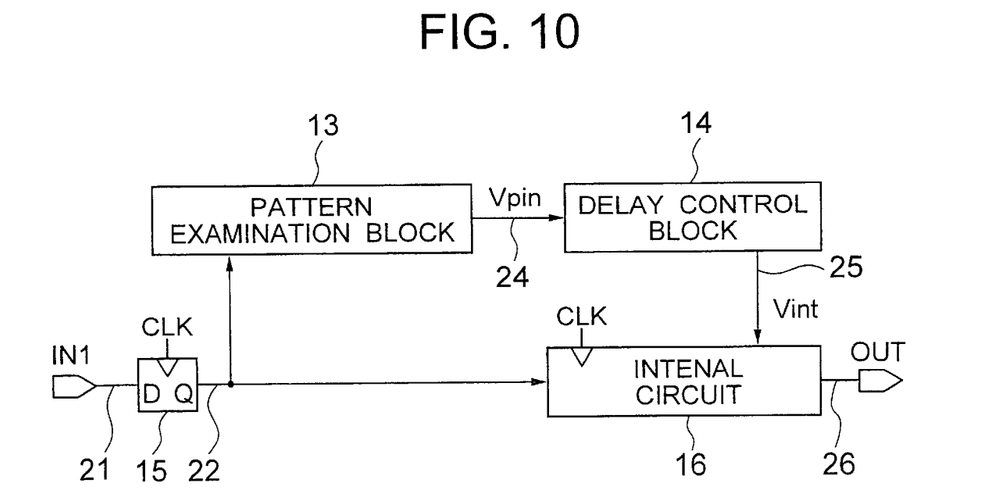
FIG. 10 is a block diagram of a semiconductor integrated circuit according to a second embodiment of the present invention.

Referring to FIG. 10, a semiconductor integrated circuit according to a second embodiment of the present invention is similar to the first embodiment except that the internal circuit 16 is designed as a single block in the present embodiment.

In the present embodiment, the input signal IN1 is processed by the pattern examination block 13 and the delay control block to reflect the input signal pattern IN1 on the internal source potential Vint, which is supplied to the internal circuit 16 immediately after the processing. Thus, the delay time and the dissipation in the internal circuit 16 are optimized immediately after the input of the input signal IN1.

In the present embodiment, the circuit design and the layout can be simplified because of the single block of the internal circuit 16 and a single internal source potential Vint. However, the internal circuit 16 in the present embodiment should have a wide margin of the source potential wherein a fluctuation of the internal source potential during operation thereof does not cause a malfunction, or the access time and the power dissipation should be controlled by a small change of the internal source potential Vint without causing a malfunction of the internal circuit.

Figure 11:
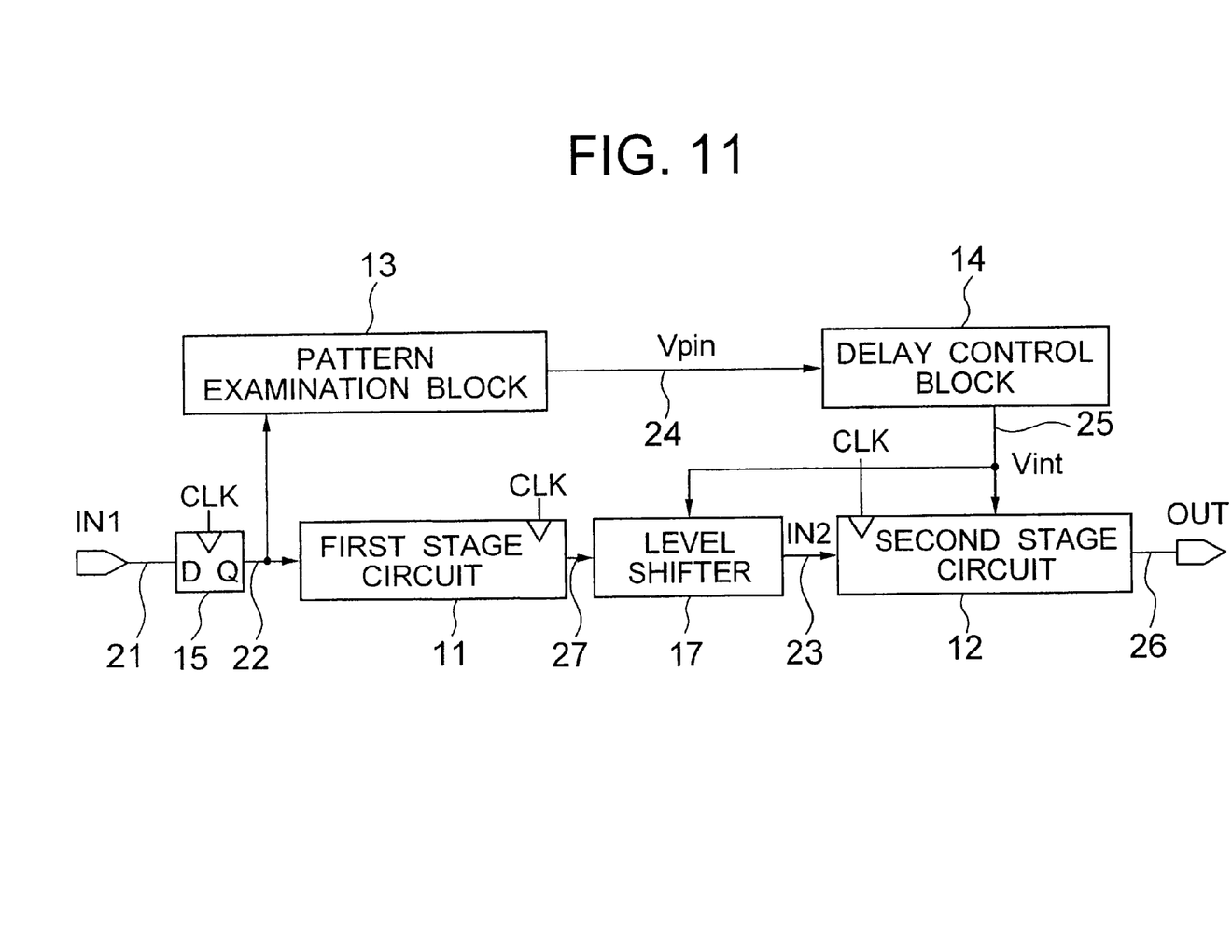
FIG. 11 is a block diagram of a semiconductor integrated circuit according to a third embodiment of the present invention.
Figure 12:
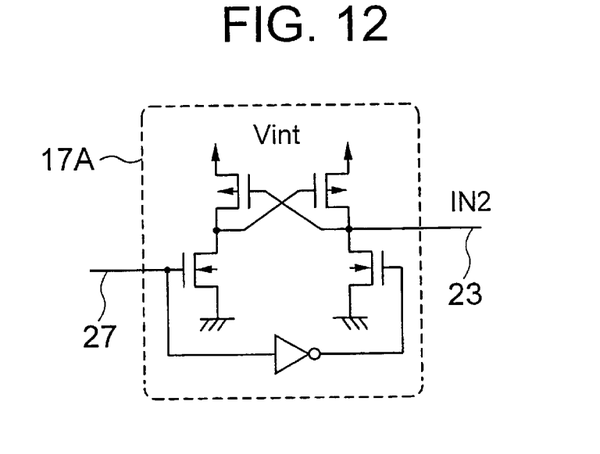
FIG. 12 is a circuit diagram of an example of the level shifter shown in FIG. 11.

Referring to FIG. 11, a semiconductor integrated circuit according to a third embodiment of the present invention is similar to the first embodiment except that a level shifter block 17 is interposed between the output signal lines 27 of the first stage internal circuit 11 and the input signal lines 23 of the second stage internal circuit 12. The second stage internal circuit 12 operates on the internal source potential Vint which is different from the external source potential Vdd on which the first stage internal circuit 11 operates. The level shifter block 17 includes a plurality of level shifters each corresponding to one of the pairs of signal lines 27 and 23. Each level shifter has a known configuration such as shown in FIG. 12. The level shifter 17A is used for converting the signal level output from the first stage internal circuit 11 to a signal level of the internal source potential Vint. This configuration allows a stable takeover of the processing by the second stage internal circuit 12 from the first stage internal circuit 11.

Figure 13:
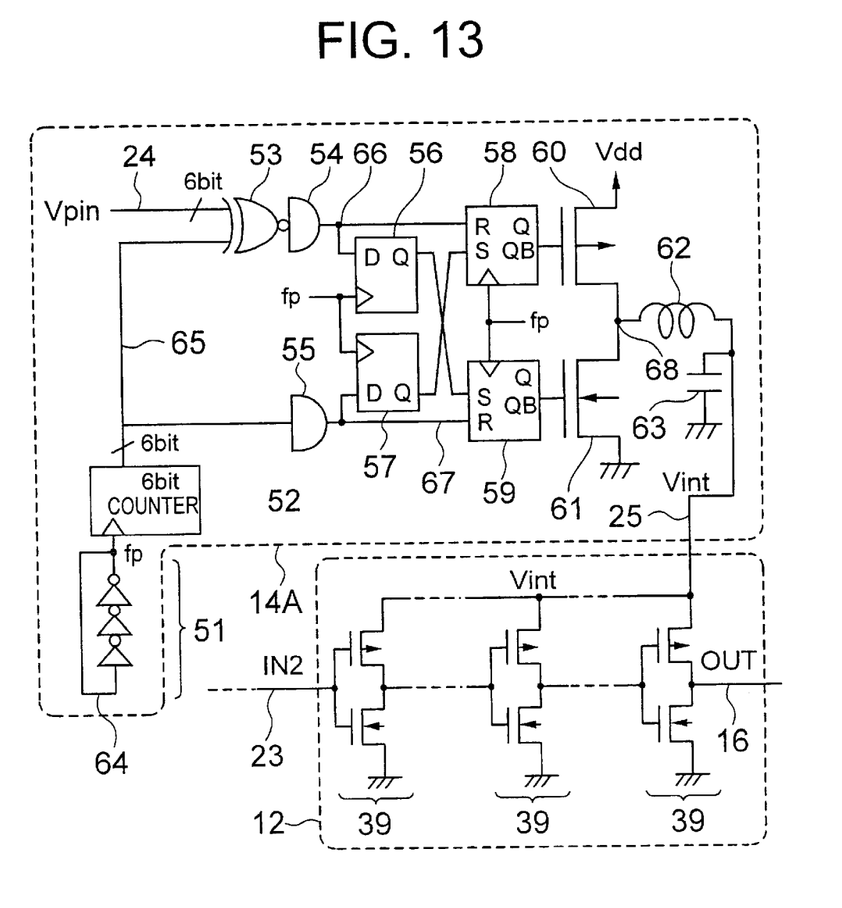
FIG. 13 is a circuit diagram of the delay control block 14 shown in FIG. 11.

Referring to FIG. 13, there is shown another example of the delay control block 14A, which is implemented by a DC-DC converter. The DC-DC converter 14A shown in FIG. 13 is described in "IEEE JOURNAL OF SOLID-STATE CIRCUITS", VOL. 33, March, 1998, pp454–462. The depicted delay control block 14A has a 6-bit configuration as an example. This configuration can be used for a 3-bit delay control signal Vpin output from the pattern examination block 13 shown in FIG. 6 receiving the 3-bit input signal on the most significant three bits of the delay control block of FIG. 13, with the remaining three bits be maintained at the external source potential Vdd.

A ring oscillator 51 includes cascaded inverters in an odd number with the input thereof connected to the output thereof to form a circular signal path, and generates an internal clock signal fp having a frequency higher than the frequency of the external clock signal CLK. A 6-bit counter 52 counts up at a rising edge of the internal clock signal fp, and delivers the count thereof via output lines 65. The 6-bit counter is reset at a next rising edge of the internal clock signal each time the count thereof assumes 63.

A pulse width modulator includes six 2-input Ex-NOR gates 53 each disposed for a corresponding bit of 6-bit signal, a pair of 6-input AND gates 54 and 55, a pair of D flip-flops 56 and 57, a pair of R-S flip-flops 58 and 59, a p-ch driver transistor 60 and an n-ch driver transistor 61.

Each 2-input Ex-NOR gate 53 has inputs connected to one of signal lines 24 for receiving a corresponding bit of the delay control signal Vpin and a corresponding output line 65 of the 6-bit counter 52, to deliver an output to the 6-input AND gate 54. Thus, the 6-bit signal from the counter 52 and the delay control signal Vpin are compared against each another in the Ex-NOR gates 53, and the output of the AND gate 54 assumes "1" upon coincidence of the delay control signal Vpin with the count output of the counter 52, and assumes "0" other than the case of coincidence. The output of the AND gate 55 assumes "1" if the count output of the counter 52 is "63" and assumes "0" other than the case of "63".

When the count output from the counter 52 changes from "63" to "0", the p-ch transistor 60 and the n-ch transistor 61 turn ON and OFF, respectively. Thereafter, the p-ch transistor 60 charges the internal node 68 until the count output from the counter 52 becomes equal to the delay control signal Vpin. When the count output from the counter 52 exceeds the delay control signal Vpin, the p-ch transistor 60 and the n-ch transistor 61 turn OFF and ON, respectively. Thereafter, the n-ch transistor discharges the node 68 until the count output from the counter 52 becomes "0". Thus, the pulse width modulator shown in FIG. 13 generates a pulse having a pulse width corresponding to the delay control signal Vpin by using a pulse width modulation technique.

An inductor 62 and a capacitor 63 form a secondary low-pass filter, which smoothes the potential of node 68 and delivers the smoothed output to the second stage internal circuit 12 as the internal source potential Vint via the internal source line 25. During the smoothing for the internal source potential Vint, the inductor 62 stores and discharges an energy as a flux, whereby the DC-DC converter has a lower power loss, and is advantageous over the preceding example of FIG. 8.

Figure 14:
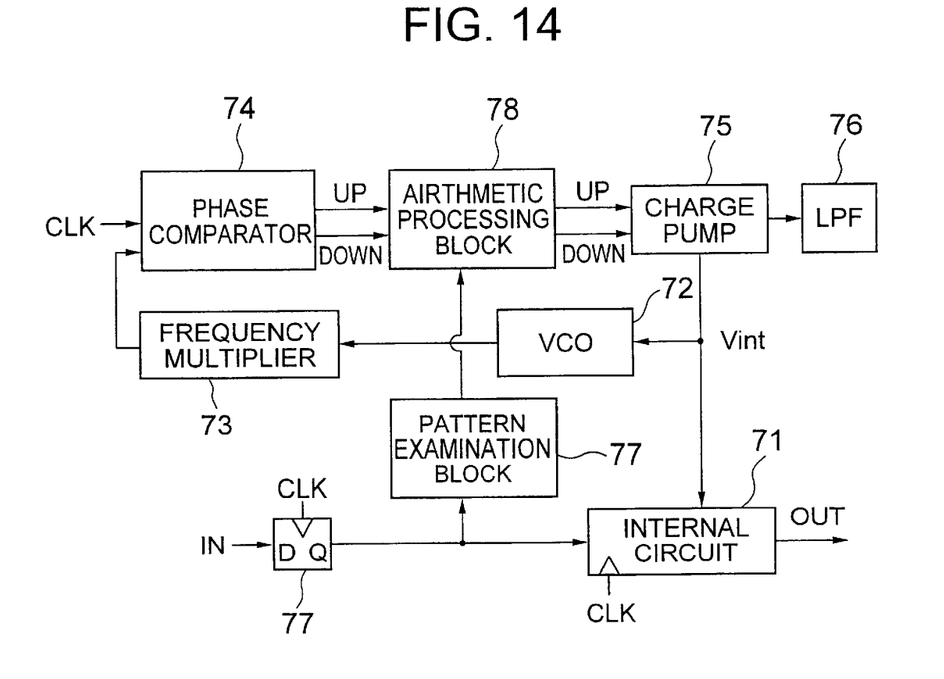
FIG. 14 is a block diagram of a semiconductor integrated circuit according to a fourth embodiment of the present invention.

Referring to FIG. 14, a semiconductor integrated circuit according to a fourth embodiment of the present invention is obtained by applying the present invention to the conventional integrated circuit shown in FIG. 4. The integrated circuit of the present embodiment includes a pattern examination block 77 for detecting the input signal pattern and an arithmetic processing block 78 interposed between the phase comparator 74 and the charge pump 75, in addition to the configuration shown in FIG. 4.

In the present embodiment, the internal source potential Vint is controlled so that the output frequency of the VCO 72 is equal to 1/N of the frequency of the clock signal CLK, similarly to the conventional circuit, In the present embodiment, the arithmetic processing block 78 calculates for a weighing multiplication of the output from the phase comparator 74 based on the output from the pattern examination block 77. This configuration allows the variations of the delay time caused by the fabrication process, operational temperature and the fluctuation of the external source potential to be compensated, similarly to the conventional circuit, and allows the variations caused by the difference in the input signal pattern in the internal circuit to be compensated according to the present invention.

Figure 15:
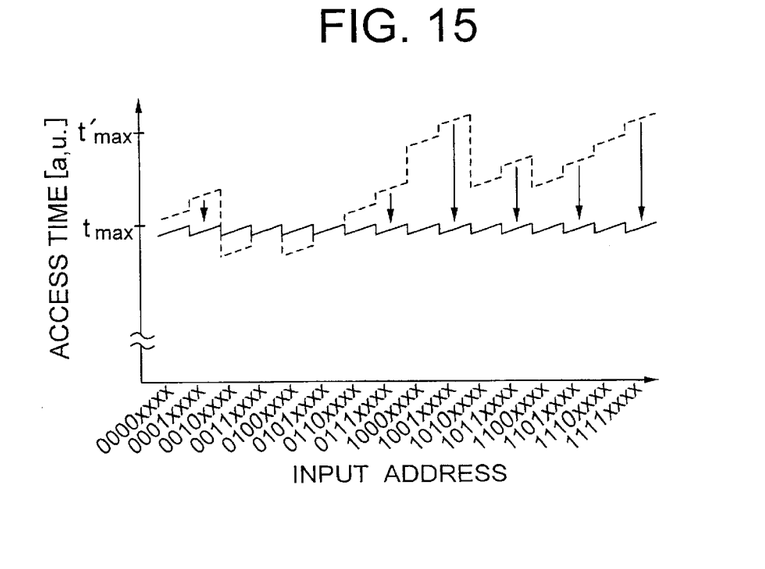
FIG. 15 is a graph showing dependency of the delay time on the input signal pattern in the fourth embodiment.

Referring to FIG. 15, the dotted line shows the graph shown by the solid line in FIG. 5, and the solid line is the access time achieved by the present embodiment, wherein the maximum access time is significantly reduced from t'max to tmax by the present embodiment.

The present invention can be applied to any of the semiconductor integrated circuits such as described in Patent Publications JP-A-8-223018, -7-264056 and 9-139656.

Figure 16:
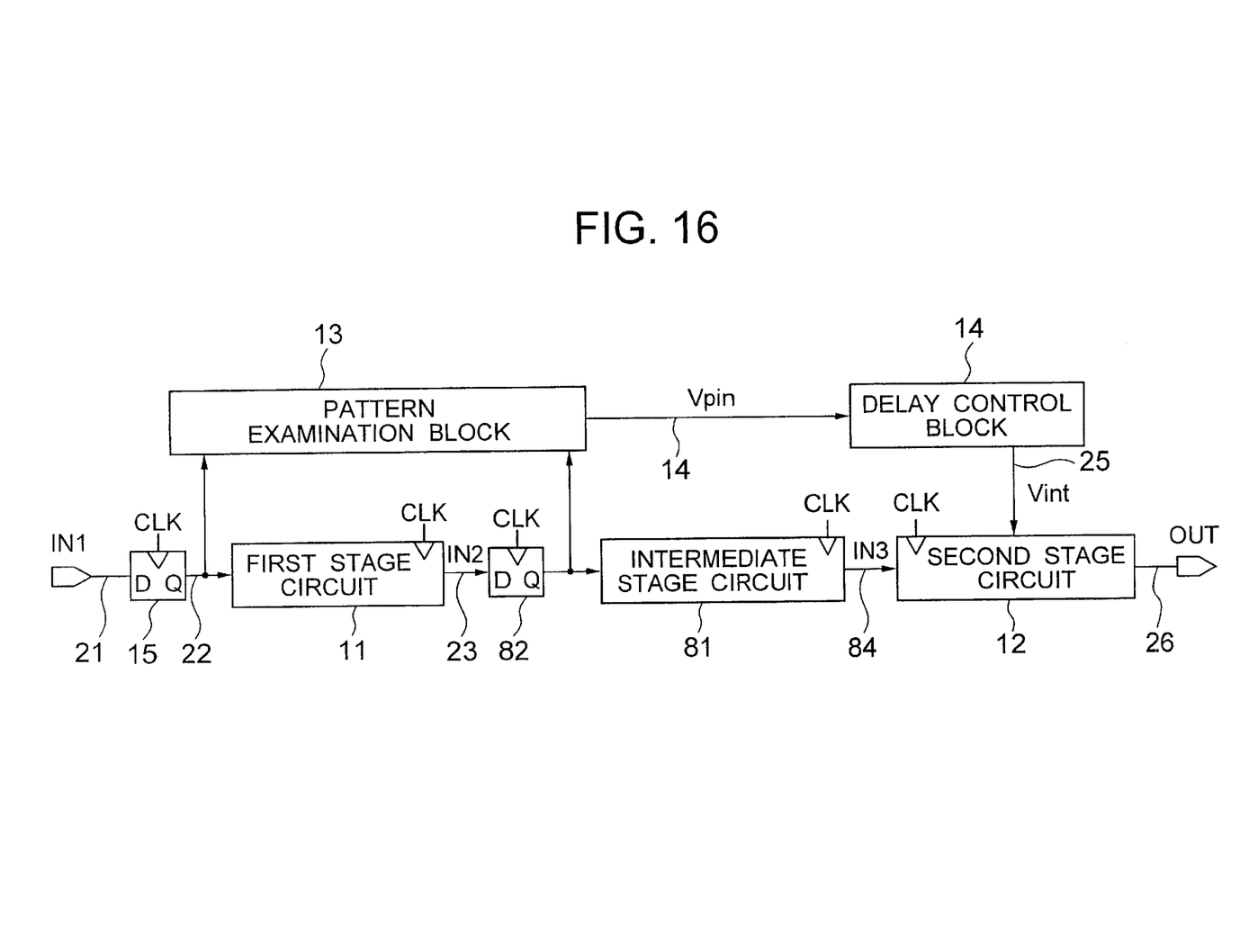
FIG. 16 is a block diagram of a semiconductor integrated circuit according to a fifth embodiment of the present invention.

Referring to FIG. 16, a semiconductor integrated circuit according to a fifth embodiment of the present invention is similar to the first embodiment except that an intermediate stage internal circuit 81 and flip-flops 82 are interposed between the first stage circuit 11 and the second stage circuit 12 in the present embodiment. The signal pattern of the input signal pattern to the first stage circuit 11 as well as the signal pattern of the signal pattern output from the flip-flops 82 through signal lines 83 is supplied to the pattern examination block 13, which examines both the input signal patterns.

In the sequential circuit in general, the data stored in the internal flip-flops are used for processing as well as the input data to the internal circuit. In view of this fact, the signal patterns on the signal lines connected to the output of all or a part of the internal flip-flops may be supplied to the pattern examination block 13. This allows the delay times of the signals to be more finely detected, whereby the delay control block can control the internal source potential more accurately.

The present invention is preferably used in a pipe-line processing using a higher operational frequency. In particular, the fifth embodiment is suitable for use in the pipe-line processing.

In the above embodiment, the delay control block reduces the voltage level of the internal source potential. However, the delay control block may raise the potential level of the internal source potential.

The control of the delay time may be also performed by controlling the back bias voltage of the MOSFET for variable threshold-voltage scheme, wherein the threshold voltage of the MOSFET is dynamically varied by substrate-bias control for reduction of active power dissipation.

The control of the delay time may be performed by controlling the internal source potential and the back bias voltage, wherein lowering both the threshold voltage and supply voltages increases the influence on static power consumption and on speed both of deviations in device parameters (such as gate length and channel dopant) and of variations in environmental factors (such as temperature and supply voltage).

Since the above embodiments are described only for examples, the present invention is not limited to the above embodiments and various modifications or alterations can be easily made therefrom by those skilled in the art without departing from the scope of the present invention.

For example, since the first stage circuit and the second stage circuit are only examples, these circuits may be parts of the internal circuit.

What is claimed is:

1. A semiconductor integrated circuit, comprising:
   an input section for receiving an input signal pattern,
   an internal circuit for operating based on said input signal pattern for a specific function,
   a pattern examination block for examining said input signal pattern to estimate a delay time in said internal circuit and deliver a delay control signal based on said estimated delay time, and
   a delay control block for controlling the delay time in said internal circuit based on said delay control signal.

2. The semiconductor integrated circuit as defined in claim 1, wherein said delay control block controls an internal source potential of at least a part of said internal circuit.

3. The semiconductor integrated circuit as defined in claim 2, wherein said internal circuit includes a first circuit operating on an external source potential and a second circuit cascaded from said first stage circuit and operating on said internal source potential, said pattern examination block estimates the delay time of said first circuit, and said delay control block reduces variation of delay times of outputs of said second stage circuit based on said control of said internal source potential.

4. The semiconductor integrated circuit as defined in claim 3, wherein at least one level shifter is interposed between said first circuit and said second circuit.

5. The semiconductor integrated circuit as defined in claim 3, wherein an intermediate circuit in association with at least one input flip-flop is interposed between said first circuit and said second circuit, and said pattern examination block additionally examines an output pattern of said flip-flop.

6. The semiconductor integrated circuit as defined in claim 5, wherein said internal circuit operates for a pipe-line processing.

7. The semiconductor integrated circuit as defined in claim 2, further comprising:
   a phase locked loop including a voltage controlled oscillator for generating an internal frequency signal based on said internal source potential,
   a frequency divider for demultiplying said internal frequency signal to output a demultiplied frequency signal,
   a phase comparator for comparing said demultiplied frequency signal against an external clock signal to output a comparison signal, and
   a charge pump for controlling said internal source potential based on said comparison signal,
   wherein said delay control block weighs said comparison signal based on said delay control signal.

8. The semiconductor integrated circuit as defined in claim 1, wherein said internal circuit includes a plurality of memory banks and an error correcting code (ECC) section, and said input signal pattern is an address signal.

9. The semiconductor integrated circuit as defined in claim 8, wherein said ECC section operates on said internal source potential.

10. The semiconductor integrated circuit as defined in claim 2, wherein said delay control block includes a voltage regulator.

11. The semiconductor integrated circuit as defined in claim 2, wherein said delay control block includes a DC-DC converter.

12. The semiconductor integrated circuit as defined in claim 2, wherein said control of said internal source potential reduces variations of a delay time of said internal circuit caused by said input signal pattern.

13. A semiconductor integrated circuit, comprising:
    an input section for receiving an input signal pattern;
    an internal circuit connected to the input section to receive the input signal pattern and for operating based on the input signal pattern for a specific function;
    a pattern examination block connected to the input section to receive the input signal pattern and for examining the input signal pattern to estimate a delay time in the internal circuit and deliver a delay control signal based on the estimated delay time; and
    a delay control block connected to the pattern examination block to receive the delay control signal and connected to the internal circuit to provide a signal for controlling the delay time in the internal circuit based on the delay control signal.

14. The circuit of claim 13, wherein,
    the internal circuit comprises a first stage circuit receiving the input signal pattern; and a second stage circuit connected in cascade with the first stage circuit, the second stage circuit receiving the signal for controlling the delay time.

15. The circuit of claim 14, further comprising:

a level shifter located intermediate the first stage circuit and the second stage circuit, the level shifter and the second stage circuit receiving the signal for controlling the delay time.

16. The circuit of claim 13, wherein the delay control block comprises:

an arithmetic processing block receiving the delay control signal from the pattern examination block;

a phase comparator providing an up input and a down input to the arithmetic processing block;

a charge pump receiving an up input and a down input from the arithmetic processing block; and a voltage controlled oscillator receiving the signal for controlling the delay time in the internal circuit based on the delay control signal and providing an output for the phase comparator.

17. The circuit of claim 13, wherein said delay control block controls an internal source potential of at least a part of said internal circuit.

18. The circuit of claim 17, wherein said internal circuit includes a first circuit operating on an external source potential and a second circuit cascaded from said first stage circuit and operating on said internal source potential, said pattern examination block estimates the delay time of said first circuit, and said delay control block reduces variation of delay times of outputs of said second stage circuit based on said control of said internal source potential.

19. The circuit of claim 18, wherein at least one level shifter is interposed between said first circuit and said second circuit.

20. The circuit of claim 19, wherein an intermediate circuit in association with at least one input flip-flop is interposed between said first circuit and said second circuit, and said pattern examination block additionally examines an output pattern of said flip-flop.

* * * * *